(12) United States Patent
Patelmo et al.

(10) Patent No.: US 6,278,159 B1
(45) Date of Patent: Aug. 21, 2001

(54) PROCESS FOR THE MANUFACTURE OF INTEGRATED DEVICES WITH GATE OXIDE PROTECTION FROM MANUFACTURING PROCESS DAMAGE, AND PROTECTION STRUCTURE THEREFOR

(75) Inventors: Matteo Patelmo, Trezzo sull'Adda; Federico Pio, Brugherio, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/344,426

(22) Filed: Jun. 25, 1999

(30) Foreign Application Priority Data

Jun. 26, 1998 (IT) .............................. TO98A0556

(51) Int. Cl.⁷ ................................... H01L 23/62
(52) U.S. Cl. .................. 257/356; 257/106; 257/603
(58) Field of Search ................ 257/355, 356, 257/106, 603

(56) References Cited

U.S. PATENT DOCUMENTS

| 5,322,803 | 6/1994 | Cappelletti et al. | 437/27 |
| 5,347,185 | 9/1994 | Tailliet | 307/540 |
| 5,610,425 | * 3/1997 | Quigley et al. | 257/358 |
| 5,668,384 | * 9/1997 | Murakami | 257/362 |

OTHER PUBLICATIONS

"Electrostatic Discharge Immune Storage Plate Structure For One–Device Cells," *IBM Technical Disclosure Bulletin*, 29(4):1514–1515, Sep. 1986.

* cited by examiner

*Primary Examiner*—Sara Crane
(74) *Attorney, Agent, or Firm*—Theodore E. Galanthay; E. Russell Tarleton; SEED IP Law Group PLLC

(57) ABSTRACT

A manufacturing process providing a zener diode formed in an N-type well housing a first N-type conductive region and having a doping level higher than the well, and a second P-type conductive region arranged contiguous to the first conductive region. The first conductive region is connected, through a third N-type conductive region having the same doping level as the first conductive region, to a conductive material layer overlying the gate oxide layer to be protected. The third conductive region, the well, and the substrate form an N⁺/N/P diode that protects the gate oxide layer during manufacture of the integrated device from the deposition of the polycrystalline silicon layer that forms the gate regions of the MOS elements.

15 Claims, 3 Drawing Sheets

PROCESS FOR THE MANUFACTURE OF INTEGRATED DEVICES WITH GATE OXIDE PROTECTION FROM MANUFACTURING PROCESS DAMAGE, AND PROTECTION STRUCTURE THEREFOR

TECHNICAL FIELD

The present invention pertains to a process for the manufacture of integrated devices with gate oxide protection from damage due to the manufacturing process, and to a protection structure therefor. In particular, the present invention relates to a process for the manufacture of integrated devices comprising gate regions of conductive material, electrically insulated with respect to the substrate by an insulating layer (gate oxide).

BACKGROUND OF THE INVENTION

During the manufacture of integrated devices, a number of technological steps are present (such as, reactive ion-etching (RIE) or plasma deposition and/or etching) which induce the charging of certain layers of the wafer being processed, and specifically of the most exposed layer. When the most exposed layer is a conductor layer (such as defining polycrystalline silicon or metal lines), the voltage is transferred along the entire conductive line, and the system tends to discharge through the weakest point, usually represented by the gate oxide region. This situation is, however, undesirable in that it jeopardizes the reliability of the final device.

Proposed solutions to the foregoing include:

reducing the "antenna ratio", defined by the ratio between the area of the conductive path and the area of the gate oxide region. In this way, the total capacity of the conductor layer that discharges through the gate oxide region is decreased, and thus the amount of charge present, given the same voltage, decreases;

inserting along the interconnections suitable $N^+$/substrate diodes or $P^+$/N well diodes which limit the maximum voltage that may be reached by the conductor layer and, if forward biased, prevent the conductor layer from being charged with negative voltage.

The problem existing in the manufacture of protection diodes normally inserted in integrated devices consists in the fact that the range of allowed voltages (for which there is no protection) is too wide as compared with current requirements, and they are limited by the diode breakdown voltage, typically higher than 10 V. On the other hand, the presence of voltages higher than 10 V on gate oxide regions having a thickness of 12 nm corresponds to the application of electric fields of over 8 MV/cm. In the case of gate oxide layers having a thickness of 7 nm, there are electric fields even greater than 14 MV/cm. These voltages are much higher than normal operating conditions and are even higher than the values at which the Fowler-Nordheim tunnel effect conduction mechanisms start, which may lead to degradation of the oxide regions. In practice, with the thicknesses currently envisaged, traditional diodes are not able to intervene before voltages dangerous for the oxide layers are set up, and hence do not provide an effective protection against damages to the gate oxide layers.

SUMMARY OF THE INVENTION

The invention provides a protective structure that prevents damages to the gate oxide layer during the process of manufacturing integrated devices.

According to the invention, a process for the manufacture of integrated devices with gate oxide protection from damages due to the manufacturing process and a protective structure is provided.

Zener diodes, the breakdown voltage of which is approximately 5 V, are inserted on the interconnection lines connected to gate regions, instead of the $N^+$/substrate diodes or $P^+$/N well diodes. The insertion of zener diodes reduces the range of voltages applied to the gate oxide regions without the protection structure intervening. This is particularly advantageous in advanced-technology devices, in which the thickness of the gate oxide may be 12 nm (0.5 $\mu$m technology), 7 nm (0.35 $\mu$m technology), or 5 nm (0.25 $\mu$m technology). The operation of the devices is not affected in that, with such advanced technologies, the operating voltage is scaled down, and is at most 3.3 V with a +10% margin. The value of the breakdown voltage guaranteed by zener diodes is hence more than adequate.

In case of transistors and high-voltage interconnections, which must handle higher voltages (such as those required for the operation of devices comprising non-volatile memories), it is possible to arrange a number of zener diodes in series so as to increase the total breakdown voltage.

BRIEF DESCRIPTION OF THE DRAWINGS

For a better understanding of the invention, embodiments thereof will now be described, purely as non-limiting examples, with reference to the attached drawings in which.

DETAILED DESCRIPTION OF THE INVENTION

Figure 1:
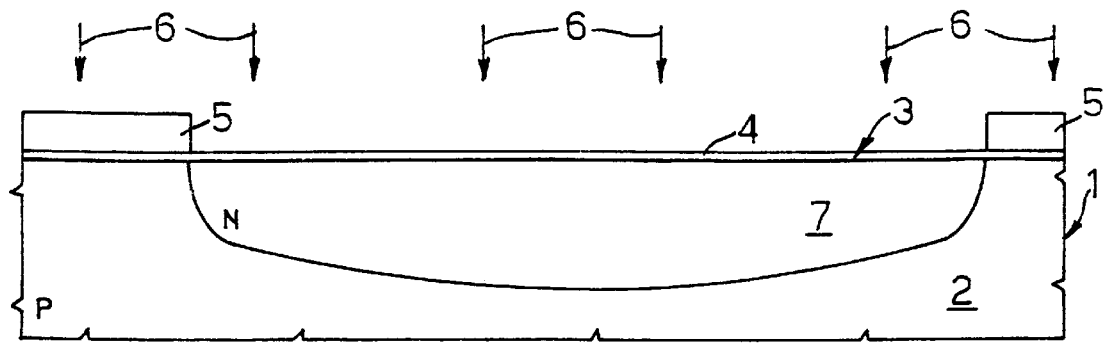
FIGS. 1–4 show cross-sections through a wafer of semiconductor material in successive steps of manufacture of a first embodiment of the invention.

FIG. 1 shows a cross-section through a wafer 1 comprising a P-type monocrystalline silicon substrate 2 in an initial step of the manufacturing process. In particular, FIG. 1 shows an ion implant with doping species able to determine an N-type conductivity (for example, phosphorous or arsenic). In detail, in FIG. 1, substrate 2, having a surface 3, is covered by a sacrifice oxide layer 4, in turn covered by a resist mask 5. Arrows 6 show the N-type implant which leads to the formation of N-type wells 7 in the areas of wafer 1 where protection structures are to be formed (only one of these structures can be seen in the figures).

Figure 2:
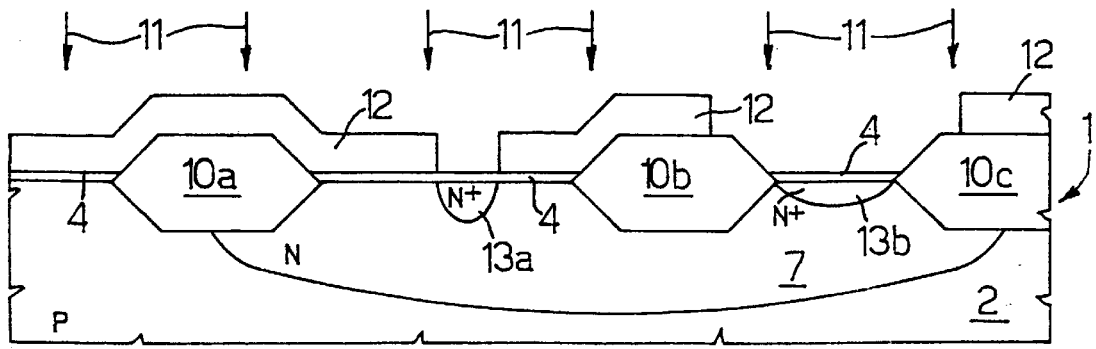

After the growth of thick field oxide regions 10a, 10b, 10c, in a way known per se, the implant of N-type doping species is carried out, as represented in FIG. 2 by arrows 11. This implant, masked by a resist mask 12, leads to the formation of $N^+$ regions having a first depth. In the example shown, two $N^+$ regions are formed, one of which is intended to form a cathode region (indicated by 13a), and the other is intended to form a cathode contact region (indicated by 13b). The cathode region 13a and the cathode contact region 13b are separated from one another by the field-oxide region 10b. In case of an integrated device comprising an EEPROM memory, the N implant for forming the regions 13a and 13b can be obtained from the capacitor implant, already present. In this case, at the same time as for the regions 13a and 13b, continuity regions (not shown) are formed, which, in the end device, extend between the tunnel region and the selection transistor, in a way known per se.

After removal of the sacrifice oxide layer 4, the gate oxide layer 14 is deposited (or a number of layers are deposited, if the main process so envisages). Where the process uses two polysilicon layers, a first polycrystalline silicon layer is deposited and defined, and an interpoly dielectric layer is formed. Then a (further) polycrystalline silicon layer is deposited and defined. Drain/source light implants can be performed and spacers can be formed at the sides of the gate regions of the transistors and memory cells. Drain/source heavy implants can also be made.

Figure 3:
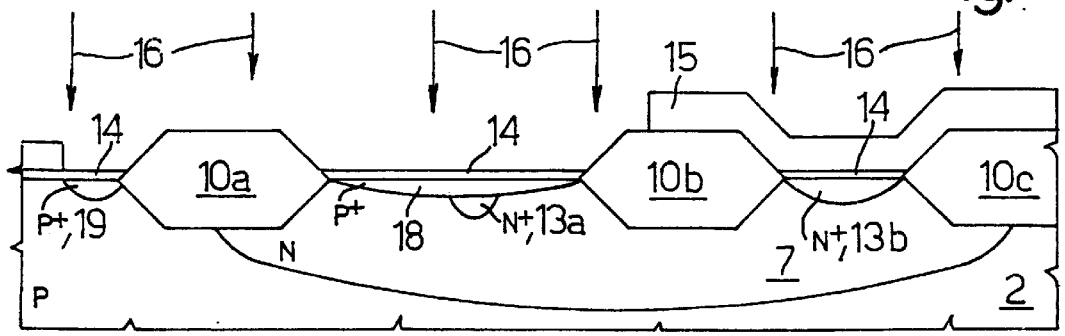

FIG. 3 shows a P-type source/drain heavy implant, masked by a resist mask 15 and represented by the arrows 16. In the area where the protective structure is to be formed, the resist mask 15 covers the cathode contact region 13b, but leaves the substrate 2 uncovered in the area between the field oxide regions 10a and 10b where the cathode region 13a is arranged, as well as outside the N-well 7. In these uncovered areas, $P^+$-type regions are then formed having a second depth smaller than the depth of the cathode region 13a and the cathode contact region 13b. In particular, the $P^+$-region, inside the N-well 7, has an area much wider than the area of the cathode region 13a. The $P^+$-region formed in the well 7 defines an anode region 18 of a zener diode. Given the different areas and different depths of the regions 13a and 18, the anode region 18 occupies the entire surface portion of the well 7 between the two field oxide regions 10a and 10b, while the cathode region 13a remains only beneath the anode region 18. The $P^+$-region outside the N-well 7 defines a substrate contact region 19, to enable good electrical connection of the zener diode with the substrate (representing the ground of the device), as clarified hereinbelow.

Figure 4:
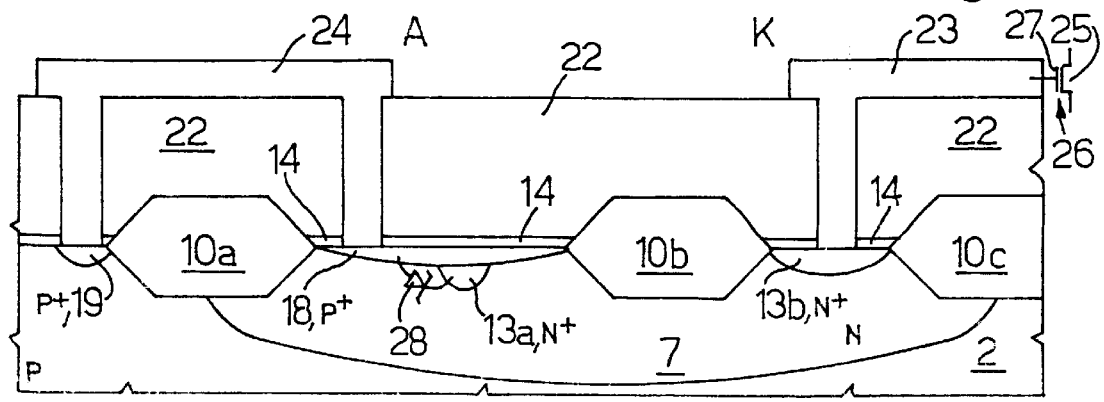

Finally, a protective dielectric layer is deposited (indicated at 22 in FIG. 4). The contacts are opened, and a metal layer is deposited and defined. The structure shown in FIG. 4 is obtained, wherein metal connections may be seen that include a first metal region 23 electrically connecting the cathode contact region 13b with the gate region of a MOS transistor 25, shown only schematically and having a gate oxide region 26 and a gate region 27, also shown only schematically, and a second metal region 24 electrically connecting the anode region 18 with the substrate contact region 19. The process ends with the final steps of coating with a passivation layer, opening of the contact pads, cutting, etc.

A zener diode 28 is thus obtained made up of the regions 18, 13a, connected to a gate region (transistor 25) through the well 7, the cathode contact region 13b and the first metal region 23, and to ground through the second metal region 24 and the substrate contact region 19. The zener diode 28 is active already from the metal layer deposition step, and protects the integrated device (and in particular the gate oxide region of the transistor 25) in the subsequent manufacturing steps.

Figure 5:
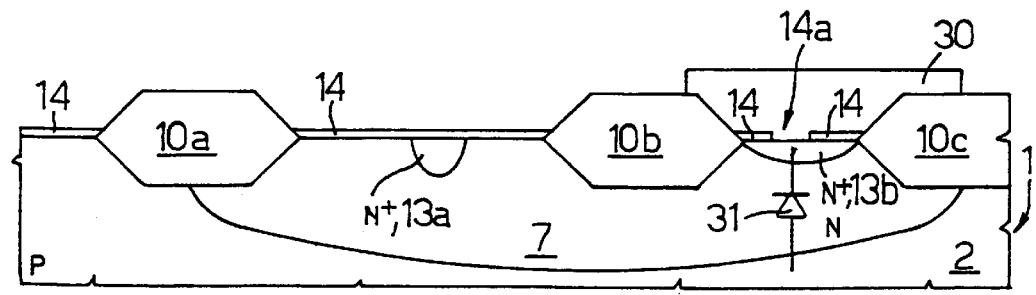
FIGS. 5–7 show cross-sections through a wafer of semiconductor material in successive steps of manufacture of a second embodiment of the invention.

According to another embodiment, it is possible to obtain protection from the (second) polycrystalline silicon layer deposition step. Referring to FIG. 57, using the same reference numbers as in FIGS. 1–4, the process comprises the initial steps described with reference to FIGS. 1 and 2 of forming the well 7, growing the field oxide regions 10a, 10b, 10c, forming the cathode region 13a and the cathode contact region 13b, depositing and shaping the gate oxide layer, and depositing and defining the first polycrystalline silicon layer and the interpoly dielectric layer, as desired, with the only difference that the gate oxide layer 14 is partially removed above the cathode contact region 13b (opening 14a in the gate oxide region 14, visible in FIG. 5).

Then, in the same way as for the embodiment according to FIGS. 1–4, a (second) polycrystalline silicon layer is deposited and is then shaped. In particular, in the second embodiment, the (second) polycrystalline silicon layer is left above the cathode contact region 13b, where it forms a poly region 30 integral with a transistor gate region 25. The poly region 30 is in direct electrical contact with the cathode contact region 13b through the opening 14a in the gate oxide layer 14. In practice, the poly region 30 is connected with the substrate 2 by an $N^+/N/P$ diode, indicated at 31 and formed by the cathode contact region 13b and the substrate itself, through the well 7, and the diode 31 is active from the deposition of the (second) polysilicon layer so as to prevent the polysilicon layer itself from being charged with negative charges and to prevent the polysilicon layer from being charged positively at a voltage higher than its breakdown voltage.

Figure 6:
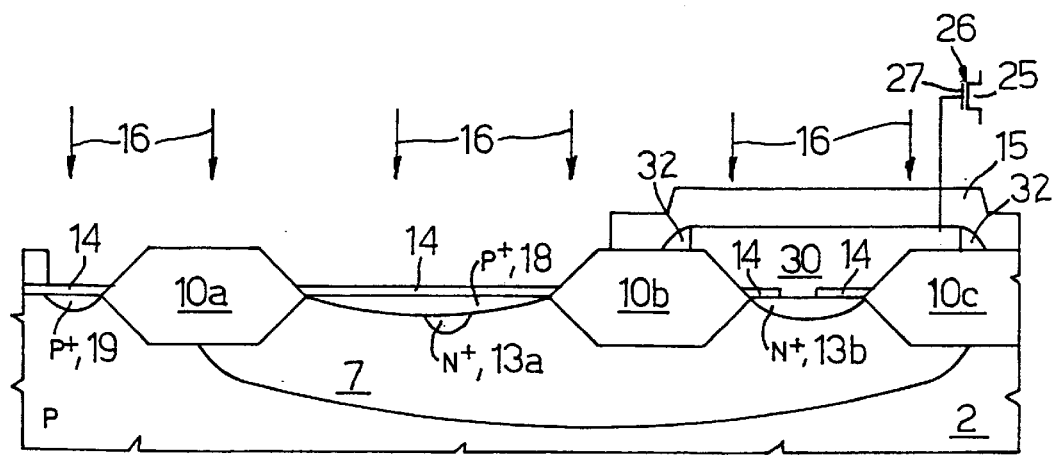
Figure 7:
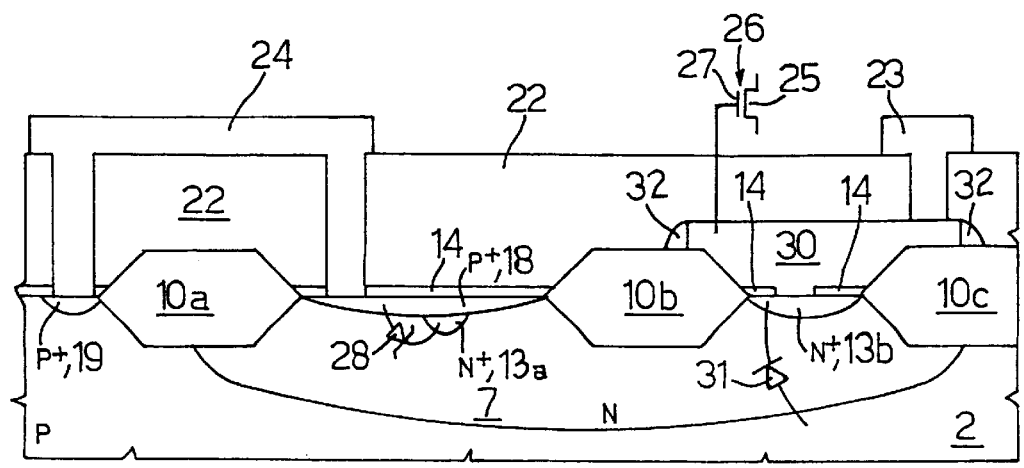

Subsequently, the process comprises steps that are similar to those described previously with reference to FIGS. 3–4. In particular, drain/source light implants can be formed. Spacers (indicated at 32 in FIG. 6) are formed at the sides of the transistor gate regions and memory cells, as well as at the sides of the poly region 30. Drain/source heavy implants are carried out both of the P-type, during which process the $P^+$-anode region 18 and the substrate contact region 19 are made (arrows 16, using the mask 15, FIG. 6) of the N-type (in a way not shown). A dielectric protection layer 22 is then deposited. The contacts are opened, and a metal layer is deposited and defined. The structure shown in FIG. 7 is thus obtained, which is similar to that shown in FIG. 4; however, here the first metal region 23 has the function of biasing the gate region connected to the poly region 30. The process is completed with the final stages already described.

Figure 9:
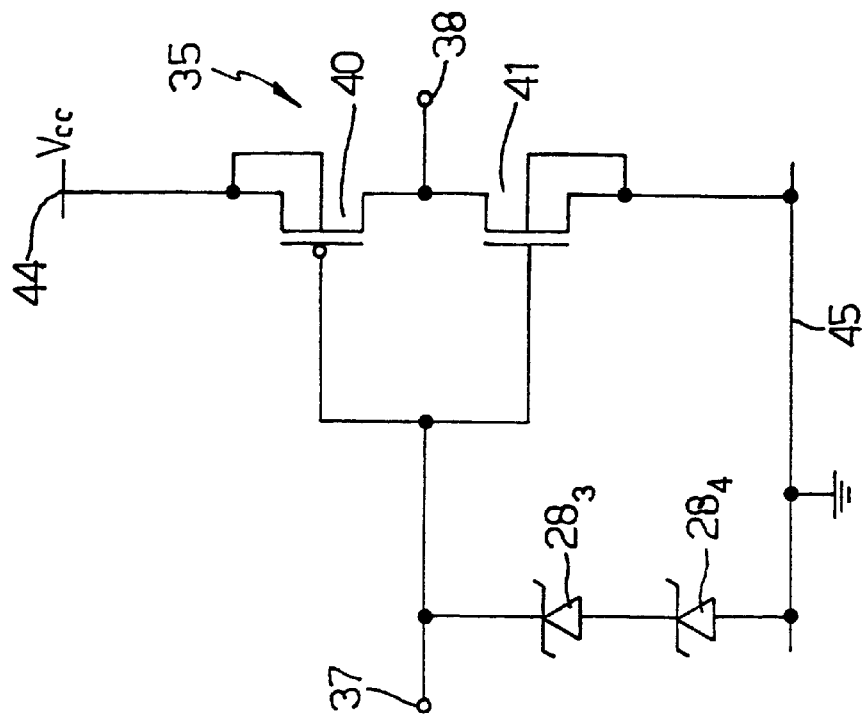
FIG. 9 shows a different protection structure.
Figure 8:
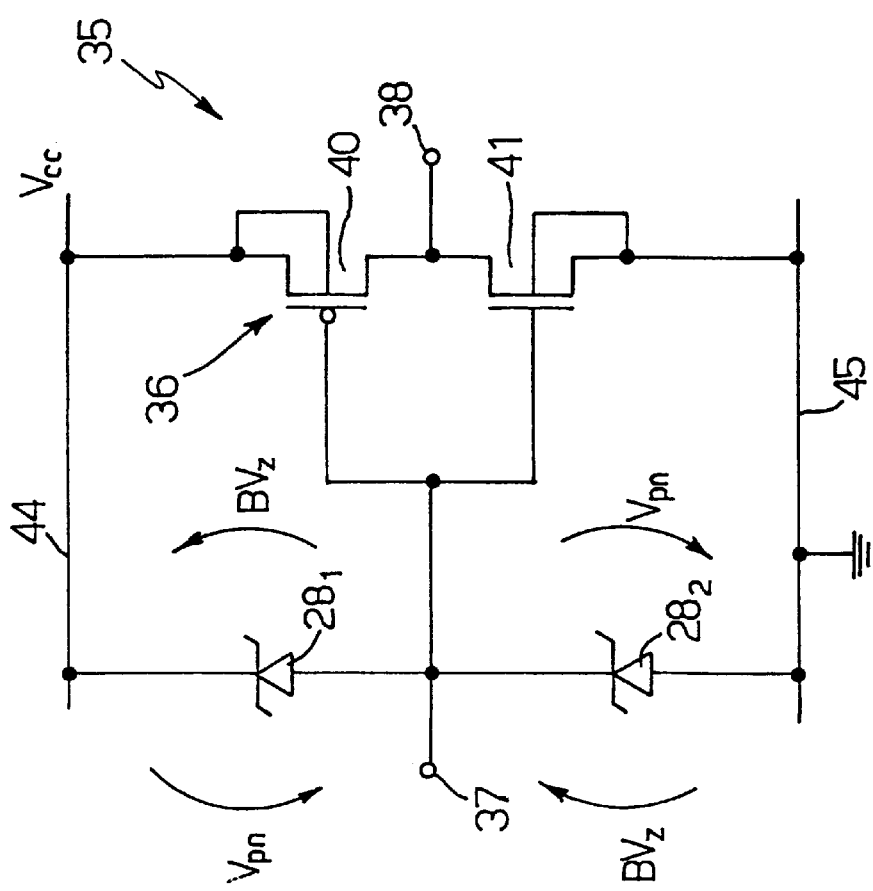
FIG. 8 shows an equivalent electrical diagram of an integrated device comprising the protection structure that may be obtained with the method of the invention.

The two processes described above make it possible, for example, to obtain the protection circuit shown in FIG. 8 or in FIG. 9.

In detail, FIG. 8 shows an integrated device 35 comprising an inverter 36 having an input node 37, an output node 38, a first PMOS-type transistor 40 and a second NMOS-type transistor 41. The input node 37 is connected to the gate terminals of the transistors 40 and 41, arranged in series between a supply line 44 set at $V_{cc}$ and a ground line (or region) 45. A zener diode $28_1$ is arranged between the input node 37 and the supply line 44; a zener diode $28_2$ is arranged between the input node 37 and the ground line (or region) 45. The zener diode $28_2$ is made and connected exactly as shown in FIG. 4 or in FIG. 7, with the anode region connected to the substrate contact region 19 through the second metal region 24, and the cathode region connected to the gate regions of the transistors 40, 41 through the first metal region 23 or the poly region 30. Instead, the diode $28_1$ shows a structure which is identical to that shown in FIG. 4 or FIG. 7 but with different connection. In particular, it is connected, via its own anode (anode region 18 in FIGS. 3–4), to the gate regions of the transistors 40, 41 through the second metal region 24, and, via its own cathode (cathode region 13a in FIGS. 2–4), to the supply line 44 through the well 7, the cathode contact region 13b and the first metal region 23. In practice, the diode $28_1$ differs from FIGS. 4 and 7 only as regards the conformation of the metal regions 23, 24.

In the protection circuit of FIG. 8, designating $BV_z$ the breakdown voltage of zener diodes $28_1$ and $28_2$ (for example, 4.5 V), and $V_{pn}$ the on voltage of diodes $28_1$ and $28_2$ when forward biased (typically, 0.7 V), and assuming that $$V_{cc} < BV_z - V_{pn} \qquad 5$$

(for instance, $V_{cc}$=3 V), we obtain that, during operation of the circuit 35, the protection circuit prevents the voltage on the input node 37 from dropping below $-V_{pn}$ or from exceeding $V_{cc}+V_{pn}$. During the manufacturing process (after deposition of the metal layer), the voltage on the input node 37 is within the range delimited by $-V_{pn}$ and $BV_z$; and for the embodiment of FIGS. 5–7, after deposition of the second polysilicon layer, the voltage on the input node 37 is within the range delimited by $-V_{pn}$ and $BV_d$ (where $BV_d$ is the breakdown voltage of the diode 31). Should the zener diode $28_1$ be left out, during operation of the circuit 35, the voltage on the input node 37 could range only from $-V_{pn}$ to $BV_z$.

Should the circuit 35 have to operate at higher potentials (and should the gate oxide layers be then designed to withstand such high potentials, e.g., 15 V), it is possible to replace the diodes $28_1$ and $28_2$ with a number of zener diodes.

A solution of this sort is shown in FIG. 9, wherein diode $28_2$ of FIG. 8 has been replaced by the connection in series of two zener diodes $28_3$, $28_4$, having a structure identical to that of the diode 28 of FIG. 4 or FIG. 7 and differing only as regards the connections.

With the protection circuit of FIG. 9, the voltage on the input node 37 may vary from $-2V_{pn}$ to $2BV_z$ during operation of the circuit and during the manufacturing process (after the metal layer deposition). In the case of the embodiment of FIGS. 5–7, after deposition of the second polysilicon layer, the voltage may vary from $-2V_{pn}$ to $BV_d$ (breakdown voltage of diode 31).

The advantages of the process and the protection structure described herein are as follows. First of all, the protection of the gate oxide layers against electrostatic discharges (ESDs) is provided during the manufacture of the associated integrated device. With the embodiment of FIGS. 5–7, the described process ensures partial protection after the deposition of the (second) polysilicon layer. Furthermore, the process does not generally require special process steps, since it is generally possible to exploit process steps already present, by suitably modifying the masks used. Consequently, the manufacturing costs are the same as for similar known processes without (ESD) protection.

Finally, it is clear that the manufacturing process and protection structure described and illustrated herein may be modified and variants may be made, all falling within the scope of the invention, as defined in the attached claims. In particular, it should be emphasized that the illustrated metal connections are mere examples, as is the integrated device to which the invention may be applied. In addition, the zener diodes may be made also in a complementary way ($P^+$ instead of $N^+$ and vice versa)if a $P^+$ implant is available in the initial steps of the manufacturing process. Finally, using a $P^+$ implant and an additional mask in an initial step of the process, it is possible to obtain complete protection starting from the polysilicon layer deposition.

What is claimed is:

1. A structure for protecting the gate oxide of integrated devices from damage arising from the manufacturing process, comprising:

a substrate of a first conductivity type housing a well of a second conductivity type and a first conductivity level;

a zener diode formed in said well and including one first conductive region having said second conductivity type and a second conductivity level, higher than said first conductivity level, and a second conductive region of said first conductivity type, adjacent to said first conductive region and forming, with said first conductive region, said zener diode;

a conductive material layer overlying said gate oxide layer to be protected and connected to said first conductive region;

a third conductive region of said second conductivity type and said second conductivity level, said third conductive region extending in an area of said well remote from said first conductive region and second conductive region;

an electrically insulating region covering said substrate, and a first metal region extending above said electrically insulating region, said first metal region having a portion crossing said electrically insulating region and in direct electrical contact with said third conductive region, said first metal region being connected to a gate region of a MOS transistor element; and a fourth conductive region extending in said substrate outside said well, and a second metal region extending above and insulated from said substrate, said fourth conductive region having said first conductivity type and a conductivity level higher than said substrate, and said second metal region electrically connecting said second conductive region and fourth conductive region.

2. The structure of claim 1 wherein said second conductive region is arranged in a surface portion of said well and has a first area; and said first conductive region is arranged beneath said second conductive region and has an area smaller than said second conductive region.

3. The structure of claim 1, further comprising a material region having a portion extending above, and in direct electrical contact with, said third conductive region and a portion defining a gate region of a MOS transistor element.

4. The structure of claim 3 wherein said material region is of polycrystalline silicon.

5. The structure of claim 1 wherein said first conductivity type is P-type and said second conductivity type is N-type.

6. An integrated circuit for protecting the gate oxide of integrated devices from damage arising from the manufacturing process, comprising:

a substrate;

a first cathode region formed in the substrate;

a first anode region formed in the substrate, the first anode region formed above the first cathode region to form a zener diode in the substrate;

a gate oxide layer formed on the substrate over the first anode region;

a substrate contact region formed in the substrate through the gate oxide layer;

a metal contact layer connecting the substrate contact region with the first anode region;

spaced-apart first and second field oxide regions in the substrate to define a first substrate region that is sized and shaped to accommodate the first cathode and first anode regions; and a cathode contact region formed in the substrate apart from the first substrate region, the contact cathode region connected to the metal contact layer.

7. The circuit of claim 6, further comprising a third field oxide region formed in the substrate and spaced apart from the first and second field oxide regions to define a second substrate region that is sized and shaped to accommodate the cathode contact region.

8. The circuit of claim 6, further comprising a polycrystalline silicon layer deposited above and in direct contact with the cathode contact region.

9. A structure for protecting the gate oxide of integrated devices from damage arising from the manufacturing process, comprising:

a substrate of a first conductivity type housing a well of a second conductivity type and a first conductivity level;

a zener diode formed in said well and including one first conductive region having said second conductivity type and a second conductivity level higher than said first conductivity level, and a second conductive region of said first conductivity type adjacent to said first conductive region and forming, with said first conductive region, said zener diode;

a conductive material layer overlying said gate oxide layer to be protected and connected to said first conductive region; and a third conductive region extending in said substrate outside said well, and a first metal region extending above and insulated from said substrate, said third conductive region having said first conductivity type and a conductivity level higher than said substrate, and said first metal region electrically connecting said second conductive region and said third conductive region.

10. The structure of claim 9, wherein said second conductive region is arranged in a surface portion of said well and has a first area, and said first conductive region is arranged beneath said second conductive region and has a smaller area than said second conductive region.

11. The structure of claim 9, further comprising a fourth conductive region of said second conductivity type and said second conductivity level, said fourth conductive region extending in an area of said well remote from said first conductive region, said second conductive region, and said third conductive region.

12. The structure of claim 11, further comprising an electrically insulating region covering said substrate, and a second metal region extending above said electrically insulating region, said second metal region having a portion crossing said electrically insulating region and in direct electrical contact with said fourth conductive region, said second metal region being connected to a gate region of a MOS transistor element.

13. The structure of claim 11, further comprising a material region having a portion extending above and in direct electrical contact with said fourth conductive region and a portion defining a gate region of a MOS transistor element.

14. The structure of claim 13, wherein said material region is of polycrystalline silicon.

15. The structure of claim 9, wherein said first conductivity type is P-type and said second conductivity type is N-type.

* * * * *